United States Patent
Arai et al.

(10) Patent No.: US 7,015,502 B2
(45) Date of Patent: Mar. 21, 2006

(54) ORGANIC SEMICONDUCTOR DEVICE AND PROCESS OF MANUFACTURING THE SAME

(75) Inventors: Yasuyuki Arai, Kanagawa (JP); Noriko Shibata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/681,216

(22) Filed: Oct. 9, 2003

(65) Prior Publication Data

US 2004/0075093 A1    Apr. 22, 2004

Related U.S. Application Data

(62) Division of application No. 10/155,971, filed on May 29, 2002, now Pat. No. 6,635,508.

(30) Foreign Application Priority Data

Jun. 1, 2001   (JP)  .............................. 2001-165986

(51) Int. Cl.
  *H01L 51/00*   (2006.01)
(52) U.S. Cl. ................. 257/40; 257/347; 257/353
(58) Field of Classification Search ............... 257/40, 257/347, 353; 438/99
   See application file for complete search history.

(56) References Cited

U.S. PATENT DOCUMENTS

| 5,567,550 A | 10/1996 | Smayling |
| 5,574,291 A | 11/1996 | Dodabalapur et al. |
| 5,677,041 A | 10/1997 | Smayling |
| 5,691,089 A | 11/1997 | Smayling |
| 5,705,826 A | 1/1998 | Aratani et al. |
| 5,942,374 A | 8/1999 | Smayling |
| 5,946,551 A * | 8/1999 | Dimitrakopoulos et al. .. 438/99 |
| 6,207,472 B1 | 3/2001 | Callegari et al. |
| 6,300,988 B1 * | 10/2001 | Ishihara et al. ............... 349/43 |
| 6,326,640 B1 | 12/2001 | Shi et al. |
| 6,429,457 B1 | 8/2002 | Berggren et al. |
| 6,452,207 B1 | 9/2002 | Bao |
| 6,528,816 B1 | 3/2003 | Jackson et al. |
| 2001/0029098 A1 | 10/2001 | Yamazaki et al. |
| 2002/0022299 A1 | 2/2002 | Jackson |
| 2002/0155729 A1 | 10/2002 | Baldwin et al. |
| 2002/0164835 A1 | 11/2002 | Dimitrakopolous et al. |
| 2003/0170937 A1 | 9/2003 | Eccleston |

FOREIGN PATENT DOCUMENTS

WO    WO 01/95384 A1    12/2001

OTHER PUBLICATIONS

European Search Report (Application No. 02011882.4) dated Aug. 24, 2005.

* cited by examiner

*Primary Examiner*—Tom Thomas
*Assistant Examiner*—N. Drew Richards
(74) *Attorney, Agent, or Firm*—Nixon Peabody LLP; Jeffrey L. Costellia

(57) ABSTRACT

The present invention is for providing a sophisticated active matrix type organic semiconductor device. A first electrode 102 is formed on an insulated surface. A second insulated film 104 is formed on the first electrode 102 via a first insulated film 103. An organic semiconductor film is formed on an opening part formed on the second insulated film 104 and the second insulated film 104. An organic semiconductor film 105 is obtained by polishing the same until the second insulated film 104 is exposed. Furthermore, by forming a second electrode 106 and a third electrode 107 on the organic semiconductor film 105, an organic semiconductor device of the present invention can be obtained.

29 Claims, 11 Drawing Sheets

Fig. 2A FORMATION OF GATE ELCTRODE AND GATE INSULATING FILM
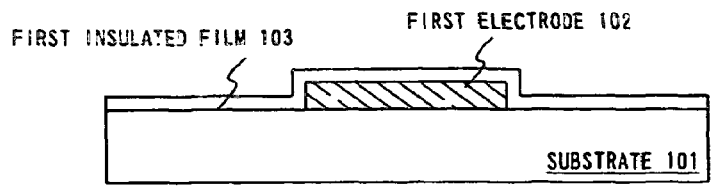
Fig. 2B FORMATION OF SECOND INSULATED FILM PATTERN
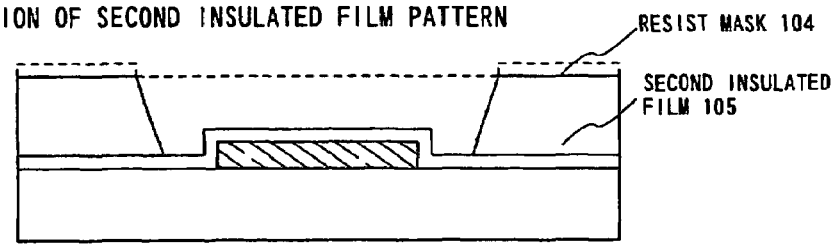
Fig. 2C FORMATION OF SECOND INSULATED FILM PATTERN
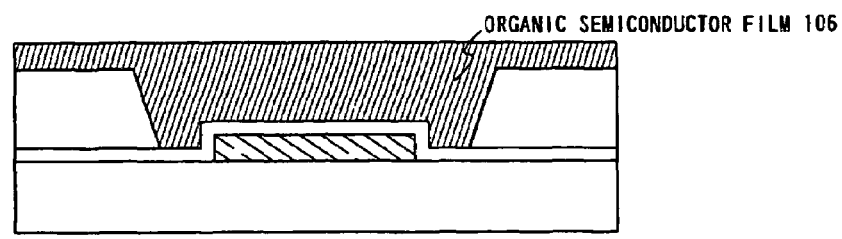
Fig. 2D FORMATION OF CHANNEL REGION
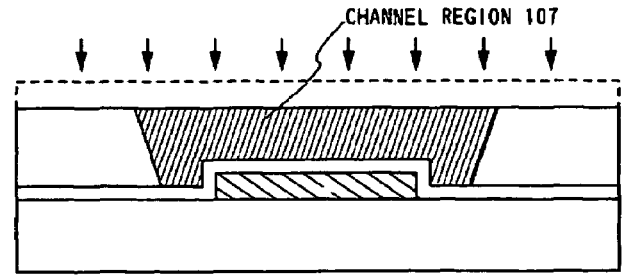
Fig. 2E FORMATION OF SECOND ELECTRODE AND THIRD ELECTRODE
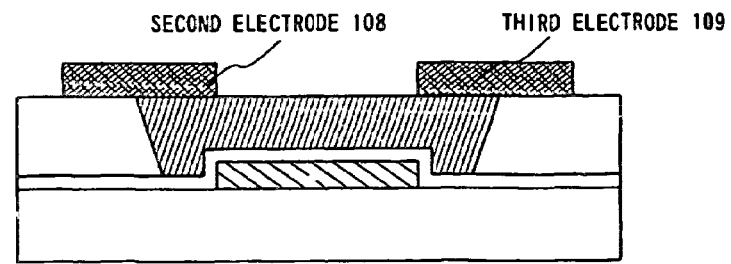

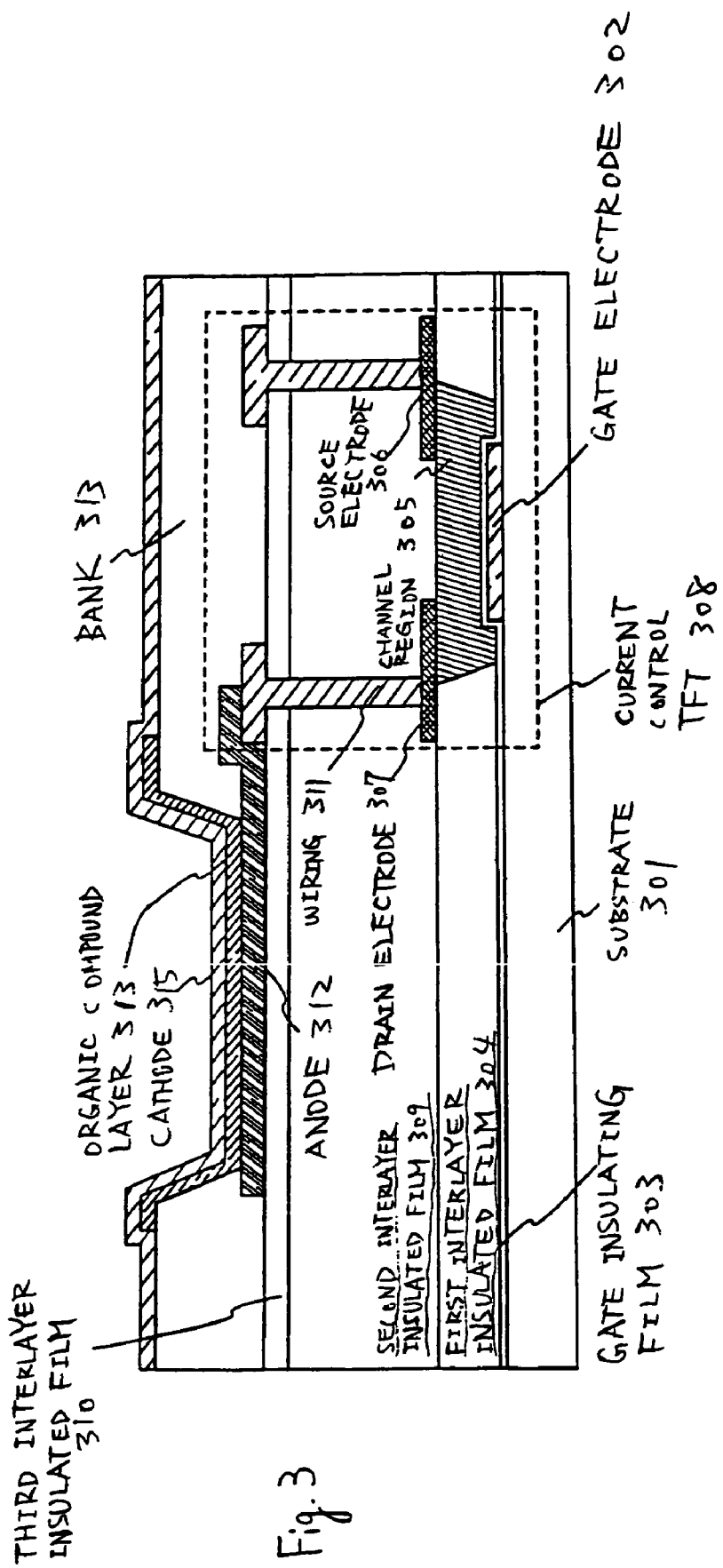

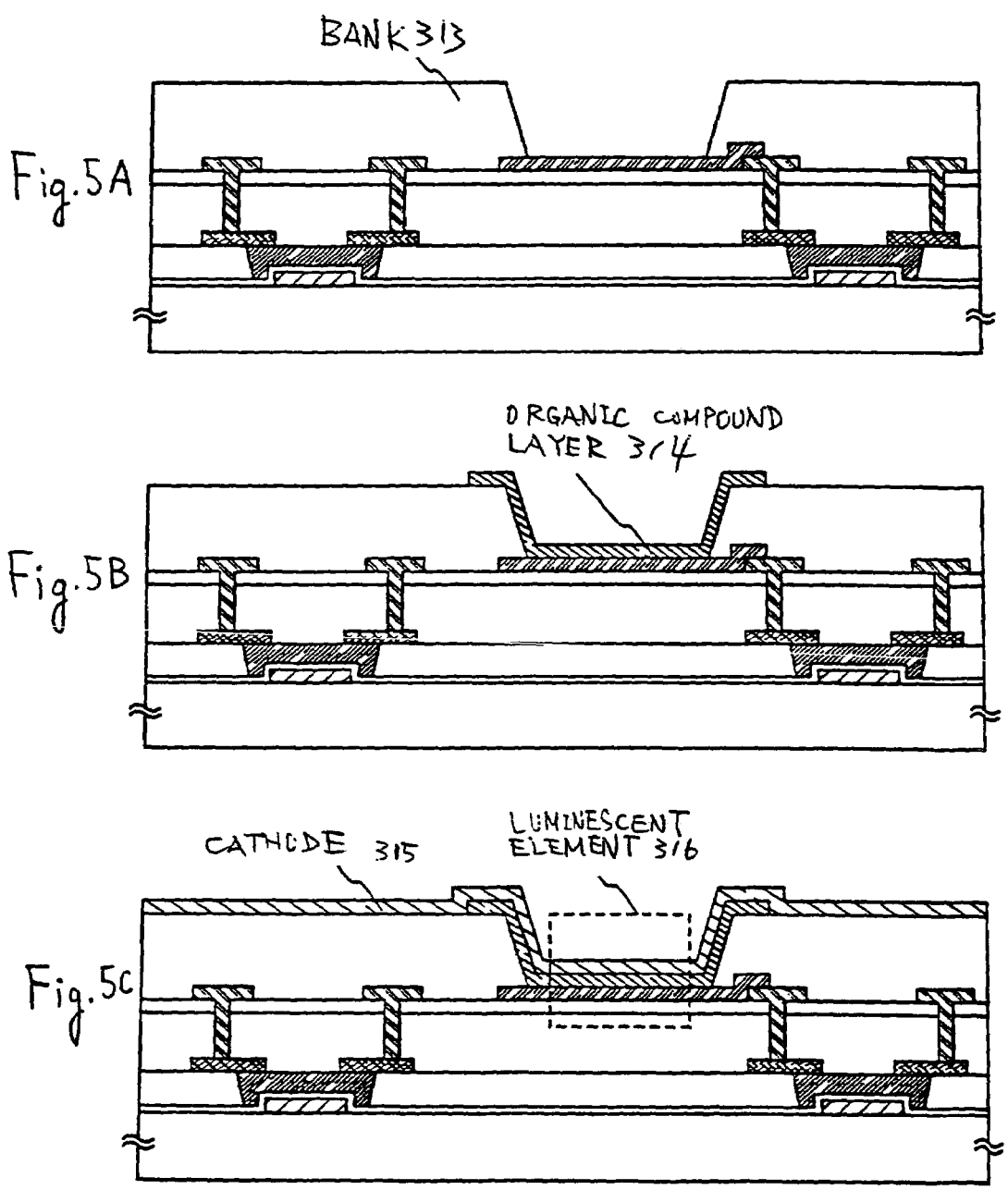

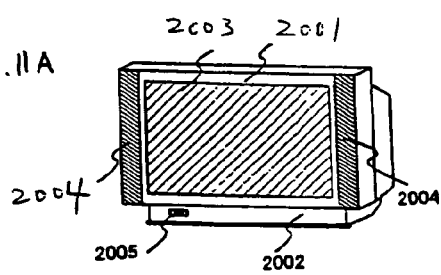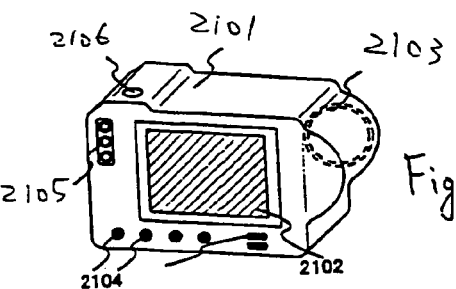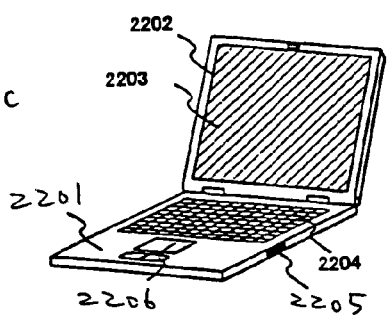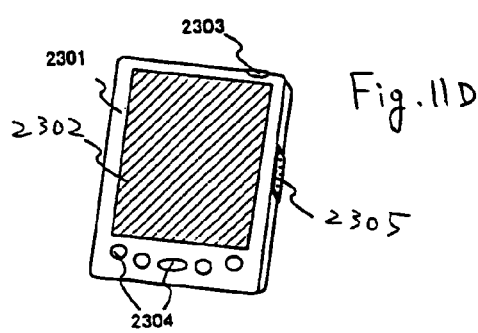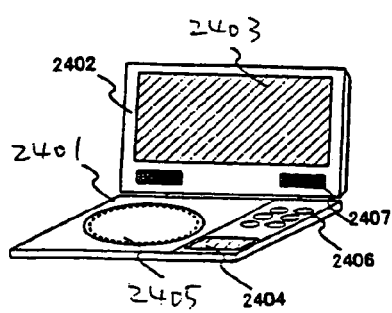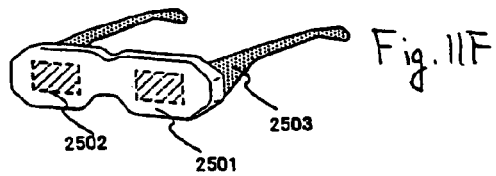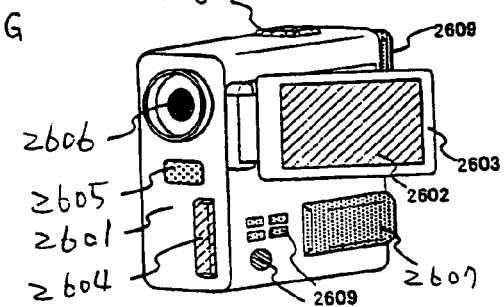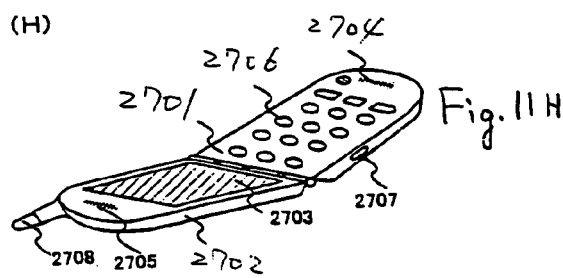

ORGANIC SEMICONDUCTOR DEVICE AND PROCESS OF MANUFACTURING THE SAME

This application is a Divisional Application of U.S. patent appication Ser. No. 10/155,971 filed May 29, 2002 now U.S. Pat. No. 6,635,508.

BACKGROUND OF THE INVENTION

1. Field of the Invention

The present invention relates to an organic semiconductor device comprising a thin film transistor (TFT) using an organic semiconductor film and a process of manufacturing the same. In this specification, the organic semiconductor device denotes the device capable of functioning by utilizing the characteristics of organic semiconductor materials on the whole, that is, it refers to active matrix type semiconductor device with a TFT provided on the same substrate. Specifically, device using a luminescent element having a film containing an organic compound (hereinafter referred to as the "organic compound layer") between a pair of electrodes, capable of obtaining the fluorescence or phosphorescence by applying an electric field thereto (hereinafter referred to as the "luminescent device"), electro-optical device such as a liquid crystal display device, electric appliances with the electro-optical device mounted as a part thereof, are also included in the range.

2. Description of the Related Art

In various kinds of semiconductor device storing a semiconductor element, such as a television image receiving device, a personal computer and a portable phone, a display for displaying characters and images is indispensable as a means for recognizing the information by a user. In particular, recently, a flat plate type display (flat panel display) represented by a liquid crystal display device, utilizing the electro-optical characteristics of the liquid crystal has been used actively.

As a form of a flat panel display, an active matrix driving method of displaying an image by providing a TFT per each pixel and successively writing a data signal, is known. The TFT serves as a prerequisite element for realizing the active matrix driving method.

Although such a TFT has been produced so far mostly utilizing an inorganic semiconductor material such as an amorphous silicon and a crystalline silicon, since the processing temperature in the manufacturing process for a semiconductor layer, or the like exceeds 350° C. in the case of forming the TFT using the material, a problem is involved in that a lot of useful substrate substances cannot be used in other cases.

In contrast, a method of producing the TFT with an organic semiconductor material has been proposed. In this specification, an organic compound showing the semiconductor-like electric property of about a $10^{-2}$ to $10^{16}$ Ωcm specific resistance is referred to as the organic semiconductor material, and a film formed with the organic semiconductor material is referred to as the organic semiconductor film. Moreover, the TFT produced using the organic semiconductor material is referred to as the organic TFT.

Since the organic TFT can be formed by the deposition method, the spin coating method, or the like of the organic semiconductor material, film formation can be enabled at a low temperature. Among the organic semiconductor materials, according to a soluble organic semiconductor material synthesized so as to be soluble in an organic solvent, coating methods such as the casting method and the spin coating method of forming a film by developing the solution on the substrate and drying can be utilized, and thus simplification of the manufacturing process can be expected. Furthermore, it is excellent in that the semiconductor film can be formed immediately without the need of the post treatment other than the drying operation.

However, in the case of forming a plurality of organic TFTs formed by a soluble organic semiconductor material, the patterning operation is difficult, and the method therefore is limited.

SUMMARY OF THE INVENTION

Accordingly, an object of the present invention is to provide a further sophisticated active matrix type organic semiconductor device by providing a method for forming a finer structure compared with the printing method and the ink-jet method, which have ever been used as a method for patterning a liquid material in the case of forming an organic. TFT using such a soluble organic semiconductor material. Furthermore, another object is to provide an electric appliance having the organic semiconductor device.

In order to solve the above-mentioned problems, the configuration of the present invention comprises a first electrode formed in contact with an insulated surface, a first insulated film formed in contact with the first electrode, a second insulated film formed in contact with the first insulated film, having an opening part on the first electrode, an organic semiconductor film formed in the opening part in contact with the first insulated film and the second insulated film, and a second electrode and a third electrode formed in contact with the organic semiconductor film but without contact with each other.

The organic semiconductor film formed in the opening part is formed on the opening part and the second insulated film and afterwards, the organic semiconductor film formed on the second insulated film in the part other than the opening part is eliminated, and thus it has the same surface as that of the second insulated film.

Moreover, since the organic semiconductor film is formed in the opening part provided by completely eliminating the second insulated film disposed on the first electrode for functioning as the gate electrode, it is formed in contact with the first insulated film as well as it has a structure to be formed at a position superimposed with the first electrode via the first insulated film.

Here, by forming the rim of the opening part with a 45 to 60 degree taper angle, film formation of the organic semiconductor material can be facilitated.

Furthermore, the second electrode and the third electrode function each as the source electrode and the drain electrode in the organic TFT, they are formed with the same material without contact with each other. As to the material of the source electrode and the drain electrode in the present invention, since most of the semiconductor materials are a p type semiconductor for transporting the positive hole as the carrier, it is preferable to use a metal with a large work function for obtaining the ohmic contact with the semiconductor layer.

Specifically, metals capable of forming an electrode using the existing photolithography, such as gold, platinum, chromium, palladium, aluminum, indium, molybdenum and nickel, alloys using these metals, or the like are preferable.

Moreover, as the organic semiconductor material used in the present invention, a π electron conjugate system polymer material having the skeleton of a conjugate double bond is preferable. Specifically, soluble polymer materials such as a polythiophene, a poly(3-alkyl thiophene) and a polythiophene derivative can be used.

Additionally, as the organic semiconductor material usable in the present invention, materials capable of forming an organic semiconductor film by treating after film formation of a soluble precursor can be presented. As such an organic semiconductor material obtainable via such a precursor, a polythienylene vinylene, a poly(2,5-thienylene vinylene), a polyacetylene, a polyacetylene derivative, a polyallylene vinylene, or the like can be presented.

In the present invention, these soluble organic semiconductor materials and the precursors are totally referred to as the soluble organic semiconductor materials. However, in the present invention, not only the above-mentioned materials, but also known organic semiconductor materials can be used as well.

At the time of converting the precursor to the organic semiconductor, not only the heating treatment but also addition of a reaction catalyst such as a hydrogen chloride is executed. In the case such a treatment is needed, a problem of corrosion of an electrode, or the like is involved, however, according to the structure of the organic TFT described in the present invention, there is no concern of the problem.

Moreover, as the representative solvents for dissolving these soluble organic semiconductor materials, a toluene, a xylene, a chlorobenzene, a dichlorobenzene, an anisole, a chloroform, a dichloromethane, a γ butyl lactone, a butyl cellsolve, a cyclohexane, an NMP (N-methyl-2-pyrolidone), a cyclohexanone, a 2-butanone, a dioxane, a dimethyl formamide (DMF) a THF (tetrahydro furan), or the like, can be presented.

Furthermore, a process of manufacturing of the present invention for realizing such a configuration, comprises the steps of forming a first electrode on an insulated surface, forming a first insulated film on the first electrode, forming a second insulated film on the first insulated film, forming an opening part at a position with the second insulated film superimposed on the first electrode via the first insulated film, forming an organic semiconductor film on the opening part and the second insulated film, polishing the organic semiconductor film until the second insulated film is exposed, and forming a second electrode and a third electrode without contact with each other by patterning the conductive film after formation of a conductive film on the organic semiconductor film.

According to the above-mentioned process of manufacturing, an organic TFT of the present invention can be produced.

In the case of forming an organic semiconductor film using a soluble organic semiconductor material in the present invention, it is preferable to use the spin coating method.

Moreover, as a method of eliminating the organic semiconductor film formed in the part other than the opening part in the present invention, the polishing method such as the mechanical method, the chemical method and the CMP (chemical mechanical polishing) method can be presented. Furthermore, in the present invention, the ashing method can be used as well.

In the case the CMP method is used in the present invention, as a polishing agent (slurry), those including the abrasive grains such as an alumina ($Al_2O_3$), a silica ($SiO_2$ powder) and a cerium oxide ($CeO_2$) can be used. Moreover, as a solution for dispersing these abrasive grains, acidic or alkaline solutions such as a sulfuric acid, a nitric acid and an ammonium solution may be used, however, pure water can be used as well. Moreover, a surfactant can be used as needed. In the CMP process of the present invention, the organic semiconductor film is polished until the surface of the second insulated film is exposed.

BRIEF DESCRIPTION OF THE DRAWINGS

FIGS. 2A to 2E are a diagram for explaining a process of manufacturing an organic TFT of the present invention.

FIG. 3 is a diagram for explaining the structure of a pixel part of a luminescent device.

FIGS. 5A to 5C are a diagram for explaining a process of manufacturing a luminescent device.

FIGS. 11A to 11H are views showing examples of electric appliances.

DESCRIPTION OF THE PREFERRED EMBODIMENT

Figure 1:
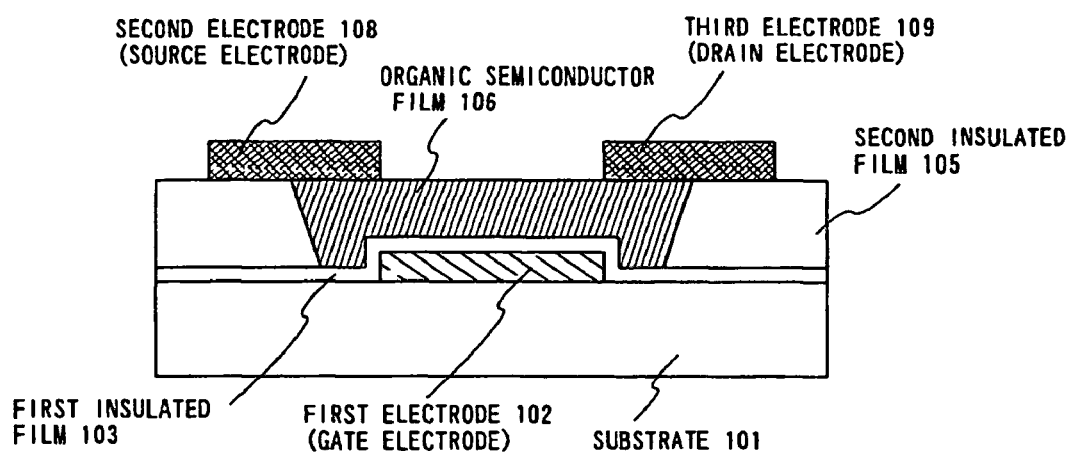
FIG. 1 is a diagram for explaining the structure of an organic TFT of the present invention.

An embodiment of the present invention will be explained in detail in view of the process of manufacturing an organic TFT in the structure shown in FIG. 1 with reference to FIG. 2. Since the numerals used in FIG. 1 and FIG. 2 are same, they can be referred to as needed.

In FIG. 2A, a first electrode 101 is formed by patterning a conductive film formed on a substrate 101. As the substrate 101, a glass substrate, a quartz substrate, a ceramic substrate, or the like can be used. Moreover, a silicon substrate, a metal substrate or a stainless steel substrate with an insulated film formed on the surface can be used as well. Moreover, a plastic substrate having a thermal resistance to the processing temperature of this embodiment can also be used.

Moreover, the first electrode is made of a conductive material comprising one or a plurality selected from the group consisting of a W, an Mo, a Ti and a Ta. The first electrode 102 serves as the gate electrode of the organic TFT.

After formation of the first electrode 102, a first insulated film 103 is formed. As the first insulated film 103, a silicon oxide film, a silicon oxide nitride film, or an insulated film containing a silicon is used, and it is formed by the plasma CVD method or the sputtering method by a 50 to 150 nm thickness.

Next, an insulted film is formed on the first insulated film 103. As the insulating material used here, inorganic materials containing silicon such as a silicon oxide, a silicon nitride, a silicon oxide nitride and a laminated film of a combination thereof as well as organic materials such as an acrylic, a polyimide, a polyamide, a polylmide amide and a BCB (benzocyclo butene) can be used.

In the case an inorganic material is used, the film is formed by the plasma CVD method, the sputtering method or the deposition method. In the case an organic material is used, the film is formed by the spin coating method, the printing method, or the ink-jet method. The film thickness is about 10 to 500 nm.

By forming a resist mask 104 of a desired pattern after formation of the insulated film and etching by the photolithography method, a second insulated film 105 having an opening part can be formed on the first electrode 102 as shown in FIG. 2B.

Next, an organic semiconductor film 106 is formed on the first electrode 102 and the second insulated film 105. At the time, it is preferable to form the organic semiconductor film 106 by a film thickness thicker than that of the second insulated film 105 as shown in FIG. 2C.

Next, the organic semiconductor film 106 formed on the second insulated film 105 is eliminated. As the method for partially eliminating the organic semiconductor film 106, not only the polishing method (chemical method, the mechanical method, the CMP method) but also the ashing method can be used. In this embodiment, the elimination is executed by the CMP method.

As the polishing agent (slurry) used in the CMP method, one obtained by dispersing alumina ($Al_2O_3$) or silica ($SiO_2$ powder) abrasive grains in a nitric acid or an ammonium solution with a surfactant (Triton X) added, can be used. At the time, the polishing operation is executed with a 300 g/cm$^2$ pressure applied from a polishing pad. The pressure at the time of the polishing can be selected in a range of about 100 g/cm$^2$ to 500 g/cm$^2$.

As to the elimination of the organic semiconductor film by the CMP method, the eliminating operation is executed until the surface of the second insulated film 105 is exposed so as to leave only the organic semiconductor film formed in the opening part on the first electrode.

Accordingly, a channel area 107 made of an organic semiconductor film is formed on the first electrode at a position in contact with the second insulated film 105 as shown in FIG. 2D.

Furthermore, as shown in FIG. 2E, a second conductive film is formed on the second insulated film 105 and the channel area 107 using the deposition method. By patterning the second conductive film by the photolithography, a source electrode 108 and a drain electrode 109 are formed. The second conductive film is formed by a 10 to 200 nm film thickness.

The size of the source electrode 108 and the drain electrode 109 is (500×30 $\mu m^2$). In this case, the channel width W is 500 $\mu$m. The gap between the source/drain electrodes, that is, the channel length L is 30 $\mu$m.

As mentioned above, the organic TFT having a structure with the channel area 107 provided separately can be formed as shown in FIG. 1. Accordingly, a fine structure pattern can be formed using a polymer material, which can hardly be patterned despite a high carrier moving degree. As a result, since the size (in particular, the channel width) of the organic semiconductor TFT can be made smaller, the integration density can be improved.

EXAMPLES

Example 1

In this example, luminescent device of an active matrix driving method using an organic TFT explained in the embodiment will be explained. FIG. 3 shows the structure of a pixel part of the luminescent device. Moreover, the process of manufacturing the luminescent device will be explained with reference to FIGS. 4 and 5.

In FIG. 3, the channel area 305 is formed on the gate electrode 302 provided on the substrate 301 via the gate insulated film 303, and the source electrode 306 and the drain electrode 307 are formed in contact with the channel area 305. The channel area 305 is formed in the opening part provided in the first interlayer insulated film 304. Moreover, in this example, the organic TFT is referred to as a current controlling TFT 308. Since the process of manufacturing the organic TFT so far is explained in the embodiment, details thereof are not explained here.

After formation of the source electrode 306 and the drain electrode 307, a second interlayer insulated film 309 is formed. The second interlayer insulated film 309 is made of an organic resin material such as a polyimide, an acrylic and a polyimide amide. By coating these materials with a spinner and, heating and baking, or polymerizing, the surface thereof can be flattened. Moreover, since the organic resin material in general has a low dielectric constant, the parasitic capacity can be reduced.

Next, for preventing adverse effect of degassing from the second interlayer insulated film 309 on the luminescent element, a third interlayer insulated film 310 is formed on the second interlayer insulated film 309. The third interlayer insulated film 310 comprises an inorganic insulated film. Representative examples thereof include a silicon oxide film, a silicon oxide nitride film, a silicon nitride film, or a laminated film of a combination thereof. It is formed by electric discharge by the plasma CVD method with a 20 to 200 Pa reaction pressure, a 300 to 400° C. substrate temperature at a high frequency (13.56 MHz) and a 0.1 to 1.0 W/cm$^2$ electric power density. Or it may be provided by forming a hardened film containing one or a plurality selected from the group consisting of a hydrogen, a nitrogen, a halide carbon, a hydrogen fluoride and a rare gas by applying the plasma treatment to the interlayer insulated film surface.

Thereafter, a wiring 311 is formed by forming a resist mask of a desired pattern and forming a contact hole reaching to the drain electrode 307 of the current controlling TFT 308. As to the electrode material to be used here, a film is formed by the sputtering method of the vacuum deposition method with an Al, a Ti or an alloy material thereof used as the conductive metal film, and it is patterned in a desired shape.

Next, a conductive film to serve as the anode of the luminescent element will be formed. As the anode material, a transparent conductive film is used. As the transparent conductive film, a compound of an indium oxide and a tin oxide (it is referred to as an ITO), a compound of an indium oxide and a zinc oxide, a tin oxide, a zinc oxide, or the like can be used. The conductive film thickness at the time is preferably 0.1 to 1 $\mu$m.

Figure 4A:
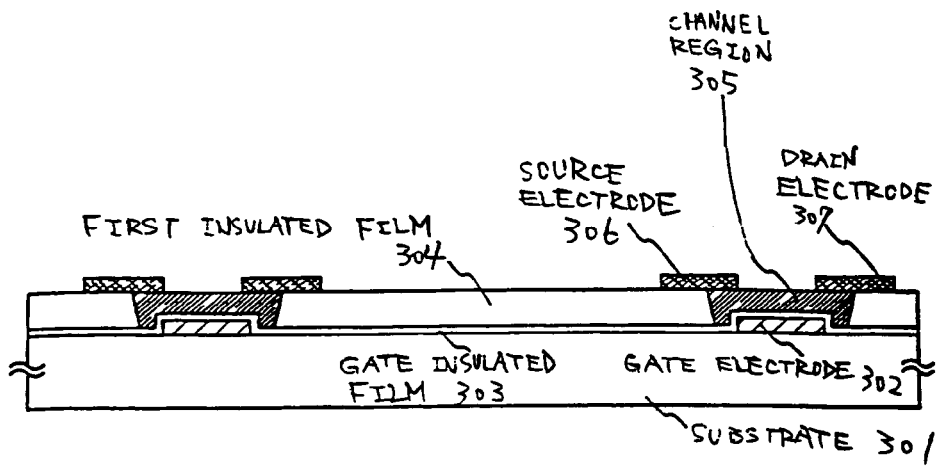
FIGS. 4A to 4D are a diagram for explaining a process of manufacturing a luminescent device.
Figure 4B:
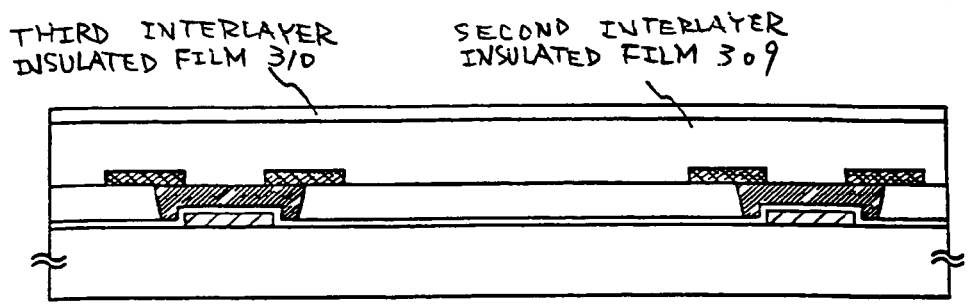
Figure 4C:
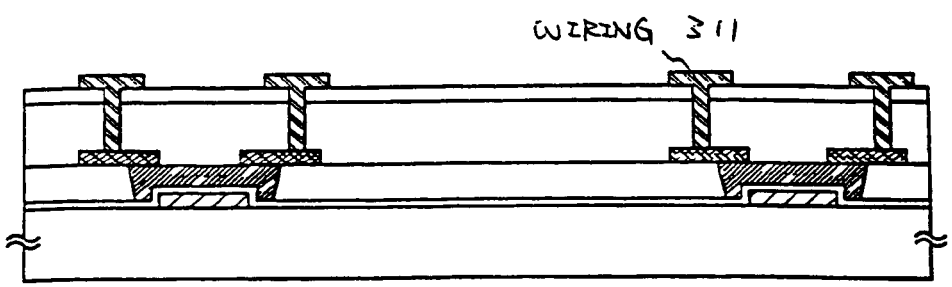
Figure 4D:
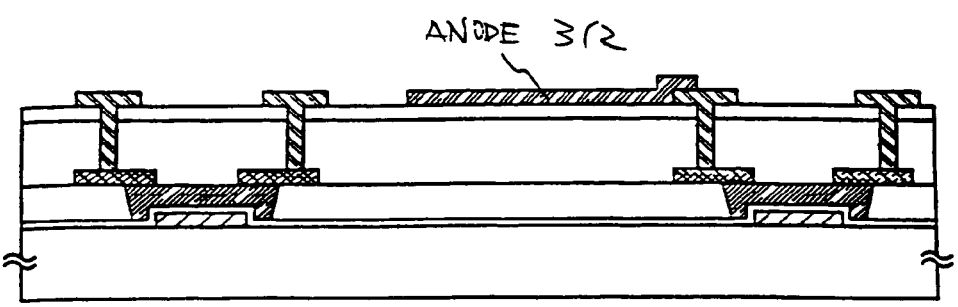

Thereafter, as shown in FIG. 4D, an anode 312 is formed by etching the transparent conductive film.

Then, as shown in FIG. 5A, an organic resin film comprising a polyimide, an acrylic and a polyimide amide is formed on the entire surface. As to these materials, thermosetting materials to be hardened by heating, or photosensitive materials to be hardened by the ultraviolet ray irradiation can be adopted. In the case a thermosetting material is used, an insulated layer 313 having an opening on the anode 312 is formed by forming a resist mask and dry etching. In the case a photosensitive material is used, an insulated film having an opening on the node 312 is formed by executing exposure and the developing treatment using a photo mask. In this specification, it is referred to as a bank 313. In either case, the bank 313 is formed so as to cover the end part of the anode 312 with the rim thereof in a tapered shape. By providing the rim in a tapered shape, the covering property of the organic compound layer to be formed subsequently can be improved.

Next, an organic compound layer 314 is formed on the anode 312. The organic compound layer 314 can be formed by laminating in addition to the luminescent layer, a plurality of layers such as a positive hole injecting layer, a positive hole transporting layer, a positive hole inhibiting layer, an electron transporting layer, an electron injecting layer and a buffer layer in a combination. Moreover, the organic compound layer 314 is formed in about a 10 to 150 nm thickness (FIG. 5B). For the formation of the organic compound layer, in the case a low molecular based material is used, the deposition method is preferable, and in the case a polymer based material is used, the spin coating method, the printing method, the ink-jet method, or the like can be used.

In this example, the organic compound layer 314 is formed on the anode 312 by the deposition method. The organic compound layer 314 is made of organic compounds showing three kinds of light emission including red, green and blue. Here, only the procedure of forming one of them is shown. Moreover, the combination of the organic compound for forming the three kinds of the organic compound layers will be explained below in detail.

The organic compound layer for the red light emission in this example can be made of an electron transporting organic compound, a blocking organic compound, a luminescent organic compound, a host material, a positive hole transporting organic compound, and a positive hole injecting organic compound.

Specifically, a tris(8-quinolinolato) aluminum (hereinafter referred to as the $Alq_3$) as an electron transporting organic compound is formed in a 25 nm film thickness. A basocuproin (hereinafter referred to as the BCP) as a blocking organic compound is formed in a, 8 nm film thickness. A 2,3,7,8,12,13,17,18-octaethyl-21H, 23H-porphyrin-platinum (hereinafter referred to as the PtOEP) as a luminescent organic compound is co-deposited with a 4,4'-dicarbazol-biphenyl (hereinafter referred to as the CBP) to serve as the host in a 25 to 40 nm film thickness. A 4,4'-bis[N-(1-naphthyl)-N-phenyl-amino]-biphen yl (hereinafter referred to as the α-NPD) as a positive hole transporting organic compound is formed in a 40 nm film thickness. And a copper phthalocyanine (hereinafter referred to as the Cu—Pc) as a positive hole injecting organic compound is formed in a 15 nm film thickness. Thereby, a red luminescent organic compound layer can be formed.

Although the case of forming a red luminescent organic compound layer using 6 kinds of organic compounds with different functions is explained here, the present invention is not limited thereto, and known materials can be used as the organic compound showing the red light emission.

A green luminescent organic compound layer in this example can be formed from an electron transporting organic compound, a blocking organic compound, a luminescent organic compound, a host material, a positive hole transporting organic compound and a positive hole injecting organic compound.

Specifically, an $Alq_3$ as an electron transporting organic compound is formed in a 40 nm film thickness. A BCP as a blocking organic compound is formed in a 10 nm film thickness. A CBP used as a positive hole transmitting host material is co-deposited with a tris(2-phenyl pyridine) iridium ($Ir(ppy)_3$) in a 5 to 40 nm film thickness. An α-NPD as a positive hole transporting organic compound is formed in a 10 nm film thickness. An MTDATA as a positive hole injecting organic compound is formed in a 20 nm film thickness. And a Cu—Pc as a positive hole injecting organic compound is formed in a 10 nm film thickness. Thereby, a green luminescent organic compound layer can be formed.

Although the case of forming a green luminescent organic compound layer using 7 kinds of organic compounds with different functions is explained here, the present invention is not limited thereto, and known materials can be used as the organic compound showing the green light emission.

A blue luminescent organic compound layer in this example can be formed from an electron transporting organic compound, a blocking organic compound, a luminescent organic compound and a positive hole injecting organic compound.

Specifically, an $Alq_3$ as an electron transporting organic compound is formed in a 40 nm film thickness. A BCP as a blocking organic compound is formed in a 10 nm film thickness. An α-NPD as a luminescent organic compound is formed in a 40 nm film thickness. And a Cu—Pc as a positive hole injecting organic compound is formed in a 20 nm film thickness. Thereby, a blue luminescent organic compound layer can be formed.

Although the case of forming a blue luminescent organic compound layer using 4 kinds of organic compounds with different functions is explained here, the present invention is not limited thereto, and known materials can be used as the organic compound showing the blue light emission.

By forming the above-mentioned organic compounds on the anode 312, an organic compound layer showing the red light emission, the green light emission and the blue light emission can be formed in the pixel part.

Moreover, as the organic compound for forming the organic compound layer, a polymer based material can be used. As the representative polymer based materials, a polyparaphenylene vinylene (PPV) based material, a polyvinylcarbazol material (PVK) based material, a polyfluorene based material, or the like can be presented.

For example, for the organic compound layer to have the red light emission, a cyano polyphenylene vinylene, for the organic compound layer to have the green light emission, a polyphenylene vinylene, and for the organic compound layer to have the blue light emission, a polyphenylene vinylene or a polyalkyl phenylene can be used.

Next, a cathode 315 is formed on the organic compound layer 314 by the deposition method (see FIG. 5C). As the material for the cathode 315, in addition to an MgAg alloy and an AlLi alloy, a film formed with elements belonging to the group I or group II in the periodic table by the co-deposition method can be used as well. The film thickness of the cathode 315 is preferably about 80 to 200 nm.

Accordingly, an element substrate having an organic TFT, and a luminescent element 316 comprising the anode 312, the organic compound layer 314 and the cathode 315 of the present invention can be formed as shown in FIG. 3.

Example 2

Figure 6A:
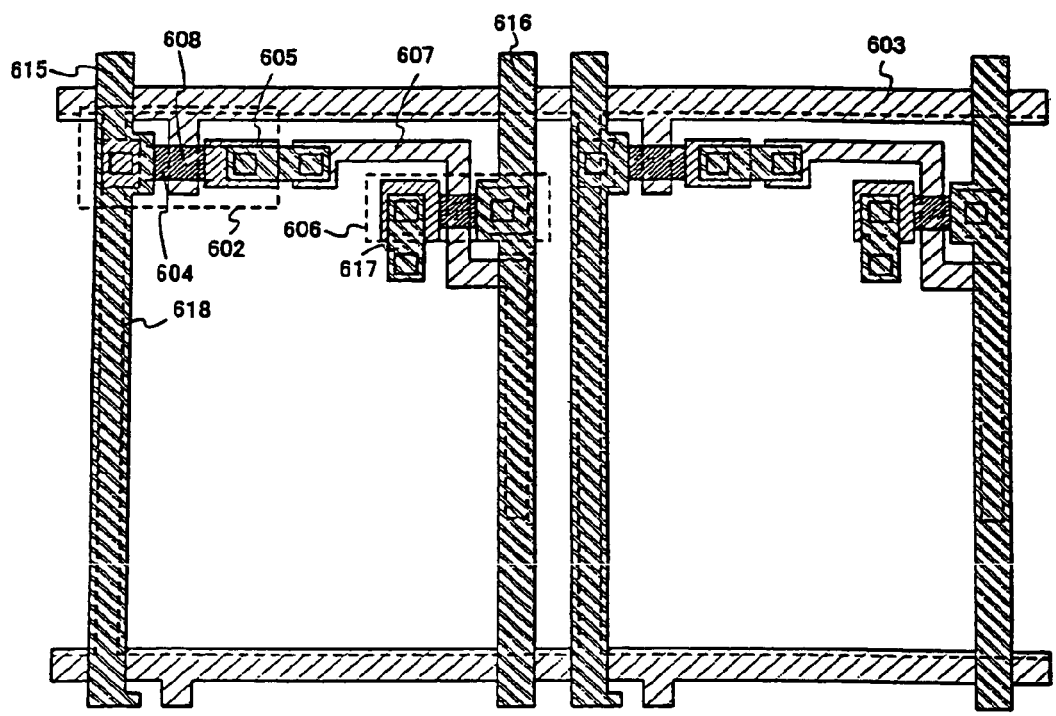
FIGS. 6A and 6B are a top view and a circuit diagram of a pixel part of a luminescent device.
Figure 6B:
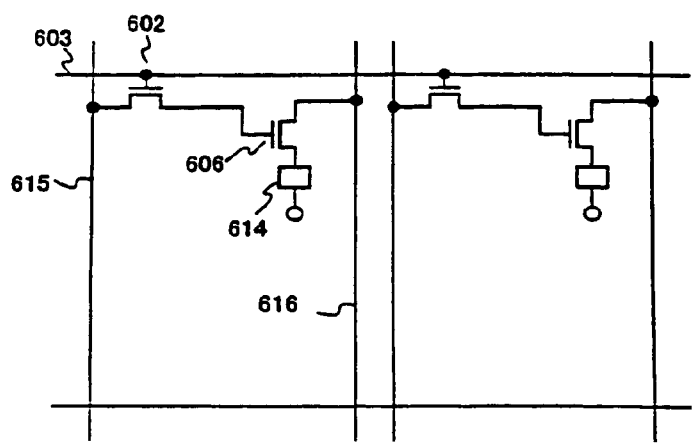

FIG. 6A is a further detailed top view structure and FIG. 6B is a circuit diagram of the pixel part of the luminescent device explained in the example 1 provided using the present invention. Since the common numerals are used in FIG. 6A and FIG. 6B, they can be referred to with each other.

In this example, the TFT shown as the area 602 is referred to as the switching TFT, and the TFT shown as the area 606 is referred to as the current controlling TFT. Both of them comprise an organic TFT of the present invention. The source of the switching TFT 602 is connected with a source signal line 615, and the drain is connected with a drain wiring 605. Moreover, the drain wiring 605 is connected electrically with a gate electrode 607 of the current controlling TFT 606.

Furthermore, a channel area 604 of the switching TFT 602 is formed ion contact with the source and the drain, and it is superimposed with a gate electrode connected electrically with a gate signal line 603.

Moreover, the source of the current controlling TFT 606 is connected electrically with a current supply line 616, and the drain is connected electrically with a drain wiring 617. Furthermore, the drain wiring 617 is connected electrically with an anode (pixel electrode) 618 shown by the dotted line.

The configuration of this example can be executed freely in a combination with the configuration of the example 1.

Example 3

In this example, a method for completing the element substrate shown in the example 1 as a luminescent device will be explained with reference to FIG. 10.

Figure 10A:
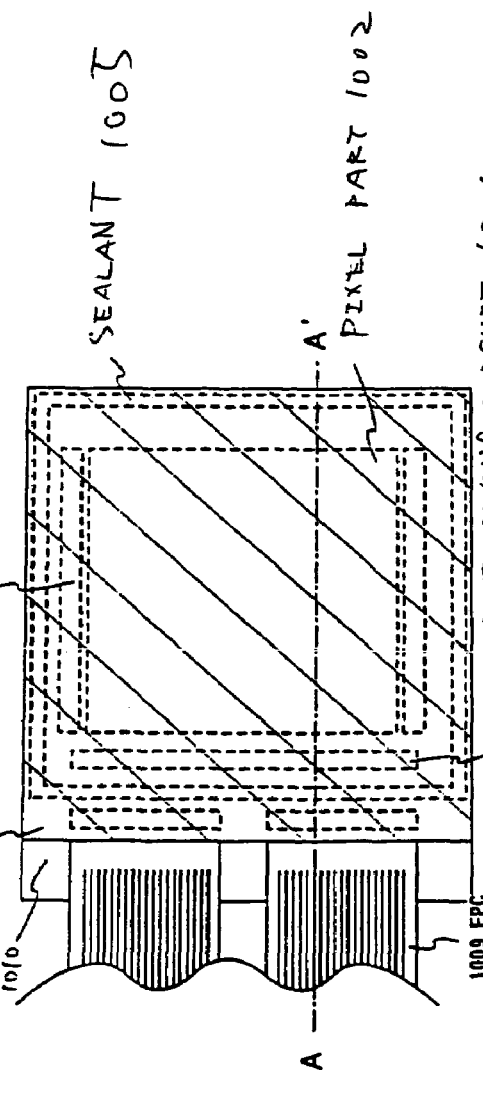
FIGS. 10A and 10B are views for explaining the sealing structure of a luminescent device.
Figure 10B:
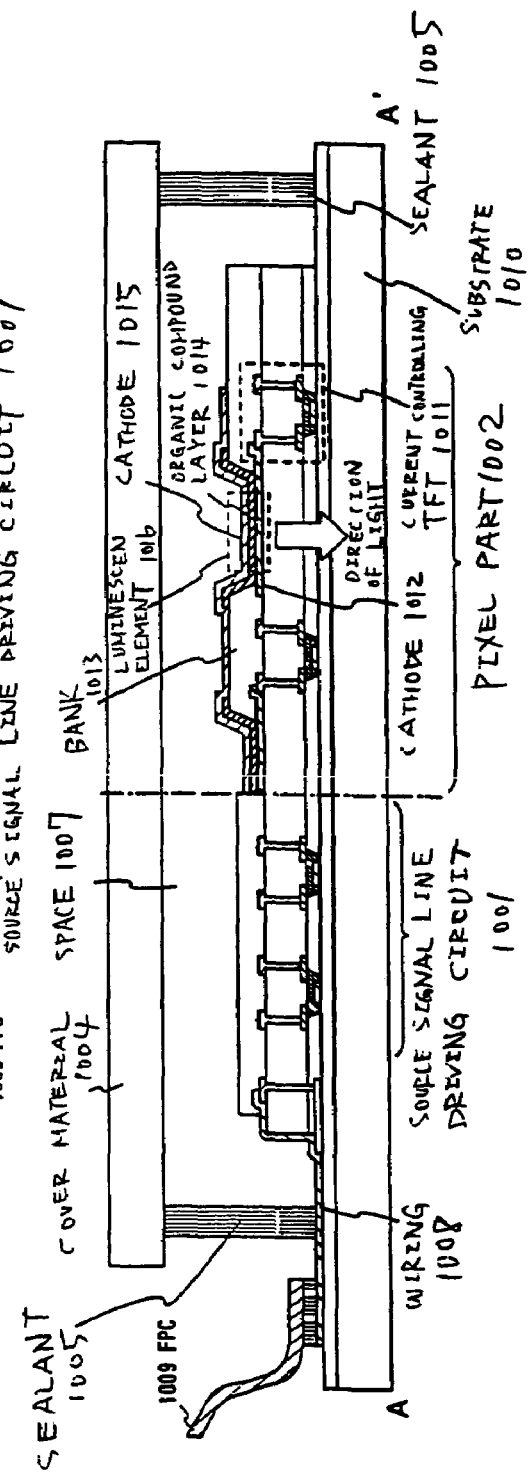

FIG. 10A is a top view of a luminescent device, and FIG. 10B is a cross-sectional view taken on the line A–A' of FIG. 10A. The numeral 1001 shown by the dotted line is a source signal line driving circuit, 1002 a pixel part and 1003 a gate signal line driving circuit. Moreover, 1004 is a cover material, 1005 a sealant, and the inside surrounded by the sealant 1005 provides a space.

The numeral 1008 is a wiring for transmitting a signal inputted into the source signal line driving circuit 1001 and the gate signal line driving circuit 1003 and for receiving a video signal or a clock signal from an FPC (flexible printed circuit) 1009 to serve as the external input terminal. Although only the FPC is shown here, a printed wiring board (PWB) may be attached to the FPC. The luminescent device in this specification includes not only the main body of the luminescent device but also one in the state with the FPC or the PWB attached thereto.

Next, the cross-sectional structure will be explained with reference to FIG. 10B. The pixel part 1002 and the source signal line driving circuit 1001 as the driving circuit are formed above a substrate 1010. The pixel part 1002 comprises a plurality of pixels including a current controlling TFT 1011 and an anode 1012 connected electrically with the drain thereof.

Moreover, a bank 1013 is formed on both ends of the anode 1012. An organic compound layer 1014 is formed on the bank 1013 and the anode 1012, and a cathode 1015 of a luminescent element 1016 is formed on the bank 1013 and the organic compound layer 1014.

The cathode 1015 serving also as a wiring provided commonly for all the pixels, is connected electrically with the FPC 1009 via the wiring 1008.

Moreover, the cover material 1004 is attached by the sealant 1005. A spacer comprising a resin film can be provided for ensuring the distance between the cover material 1004 and the luminescent element. The space 1007 in the sealant 1005 is filled with inert gas such as nitrogen. As the sealant 1005, an epoxy based resin can be used preferably. Furthermore, the sealant 1005 is preferably a material permeating a moisture content or an oxygen as little as possible. A substance having a moisture absorbing effect or a substance having an oxidation preventing effect can be contained in the space 1007.

Moreover, in this example, as the material comprising the cover material 1004, in addition to a glass substrate and a quartz substrate, a plastic substrate made of an FRP (fiberglass-reinforced plastic), a PVF (polyvinyl fluoride), a Mylar, a polyester, an acrylic, or the like can be used.

Furthermore, it is also possible to seal with the sealant so as to cover the side surface (exposed surface) after bonding the cover material 1004 using the sealant 1005.

By sealing the luminescent element in the space 1007 as mentioned above, the luminescent element can be blocked completely from the outside so that entrance of a substance promoting deterioration of the organic compound layer, such as a moisture content and an oxygen from the outside can be prevented. Therefore, a highly reliable luminescent element can be obtained.

The configuration of this example can be executed freely in a combination with the configuration of the example 1 or the example 2.

Example 4

Figure 7:
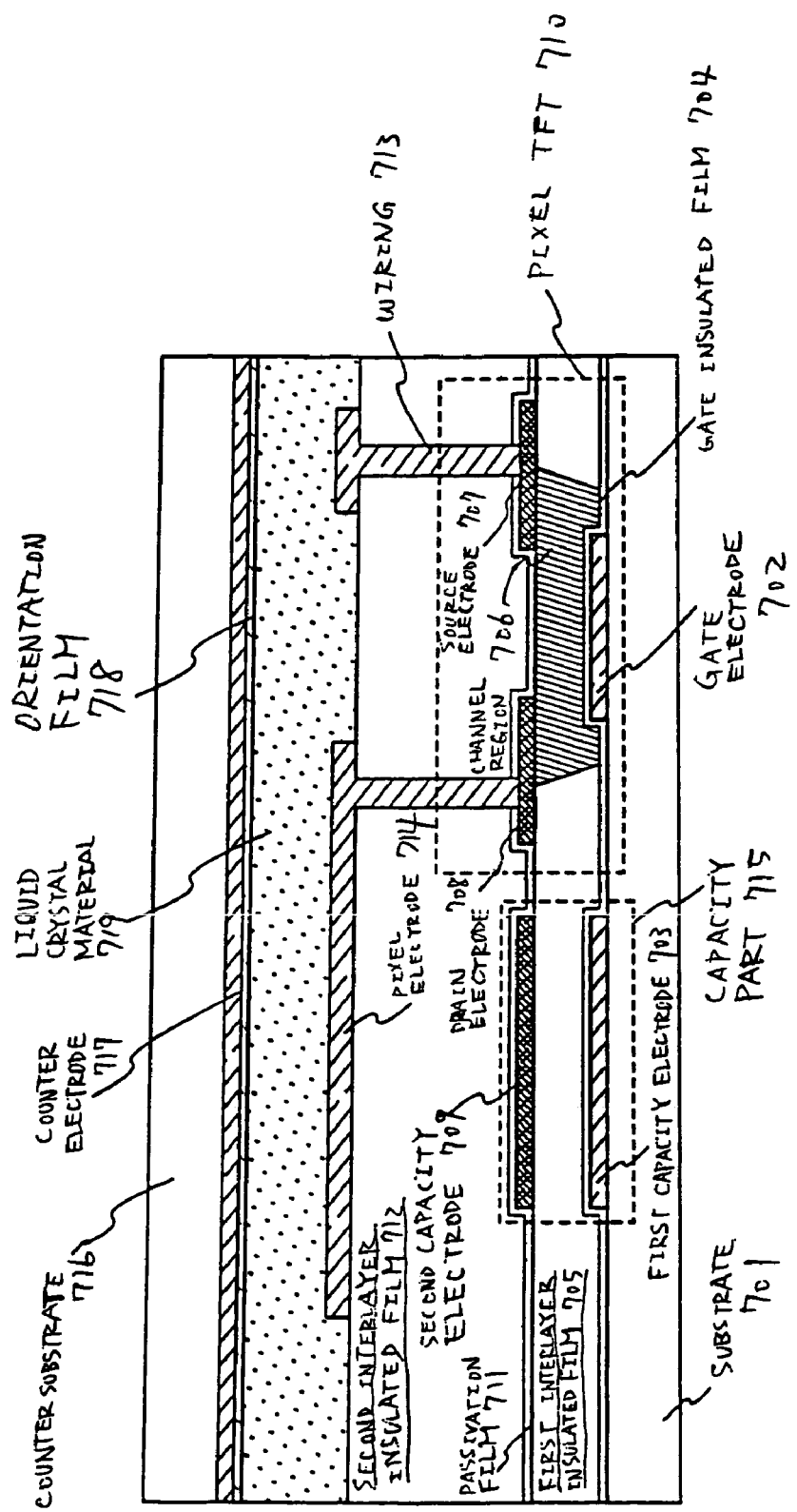
FIG. 7 is a diagram for explaining the structure of a pixel part of a liquid crystal display device.

In this example, liquid crystal display device of active matrix driving method using the organic TFT explained in the embodiment of the present invention will be explained. An example of the pixel structure suitable for the liquid crystal display device is shown in FIG. 7, and the process of manufacturing will be explained with reference to the cross-sectional view of FIG. 8. Furthermore, with reference to the top view of FIG. 9, the liquid crystal display device of this example will be explained.

In FIG. 7, a first interlayer insulated film 705 is formed via a gate insulated film 704 on a gate electrode 702 and a first capacity electrode 703 formed on a substrate 701. The first interlayer insulated film 705 has an opening part on the gate electrode 702, with a channel area 706 formed in the opening part. Furthermore, a source electrode 707 and a drain electrode 708 are formed in contact with the first interlayer insulated film 705 and the channel area 706. In this example, the source electrode 707 and the drain electrode 708 are formed, and at the same time, a second capacity electrode 709 is formed. In this example, the organic TFT formed in the pixel part is referred to as the pixel TFT 710.

After the formation of the source electrode 707 and the drain electrode 708, a passivation film 711 comprising a silicon nitride film, and a second interlayer insulated film 712 comprising an organic resin material selected from the group consisting of an acrylic, a polyimide, a polyamide and a polyimide amide, are formed. Thereafter, a wiring 713 and a pixel electrode 714 are formed by providing a hole.

Although only the pixel part is shown here, a driving circuit and a pixel part with the organic TFT formed on the same substrate are formed. In the driving circuit, according to the organic TFT, a shift register circuit, a buffer circuit, a level shifter circuit, a latch circuit, or the like can be formed.

In the pixel part, a capacity part to be connected with the pixel TFT 710 comprises the first capacity electrode 703, the first interlayer insulated film 705 and the second capacity electrode 709. The first capacity electrode 703 is connected electrically with a gate line so as to provide a capacity part 715 together with the second capacity electrode 709.

Figure 8A:
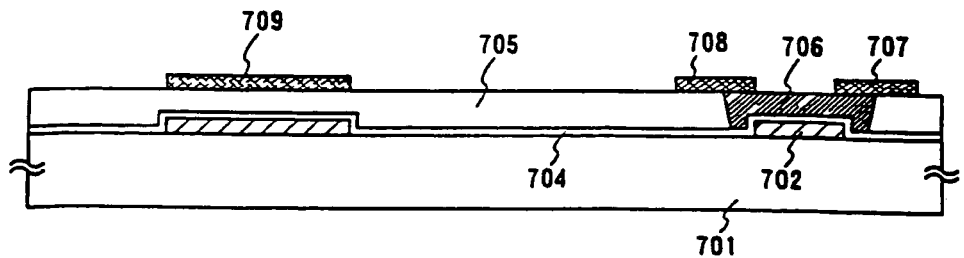
FIGS. 8A to 8D are a diagram for explaining a process of manufacturing a liquid crystal display device.
Figure 8B:
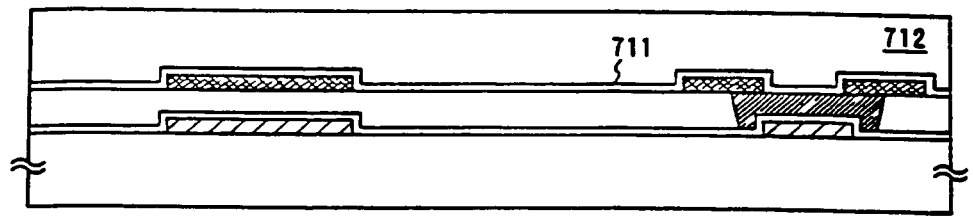
Figure 8C:
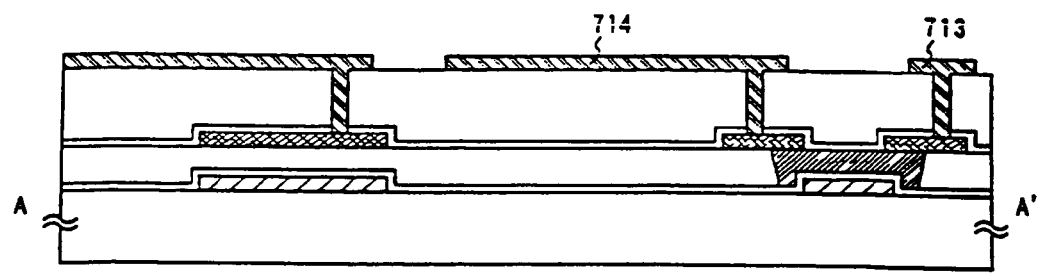
Figure 9A:
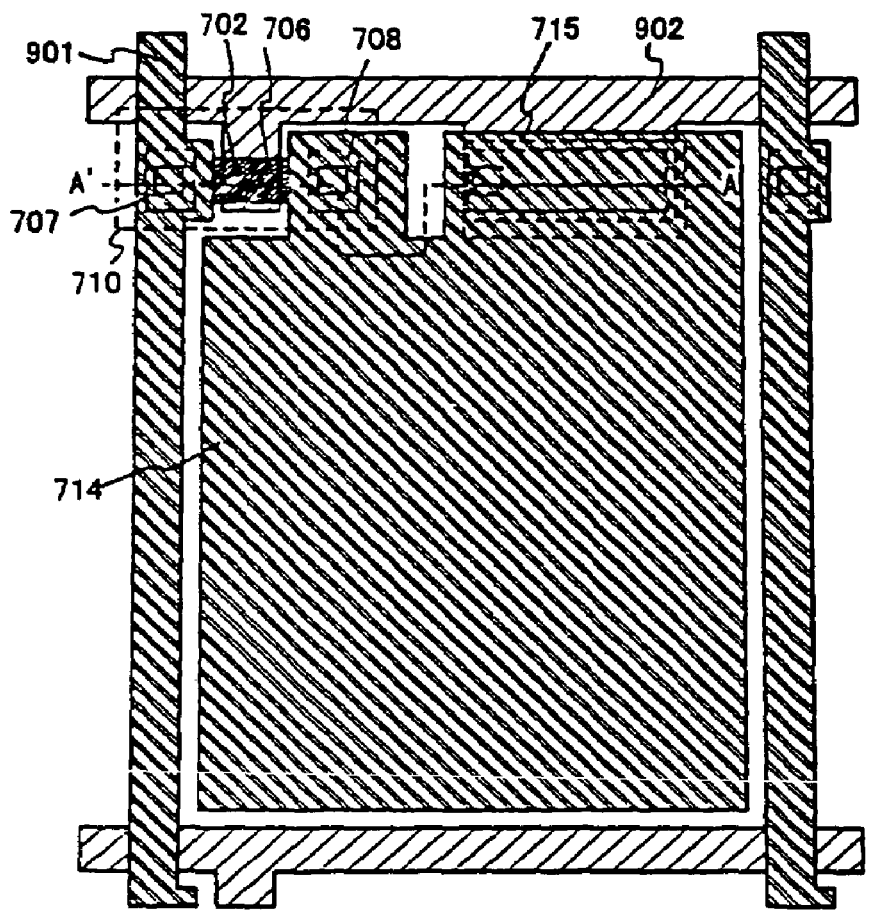
FIGS. 9A and 9B are a top view and a circuit diagram of a pixel part of a liquid crystal display device.
Figure 9B:
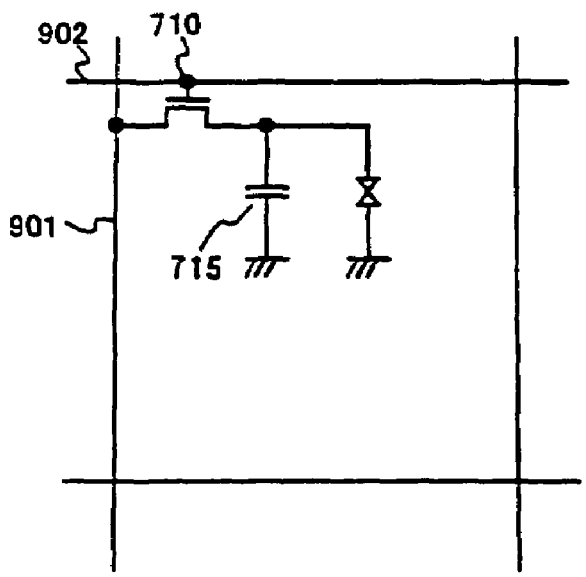

FIG. 9 is a top view of the pixel part in this state, wherein the line A–A' corresponds to FIG. 8C. The source electrode 707 of the pixel TFT 710 is connected with a source signal line 901, and the gate electrode 702 is connected with a gate signal line 902.

Figure 8D:
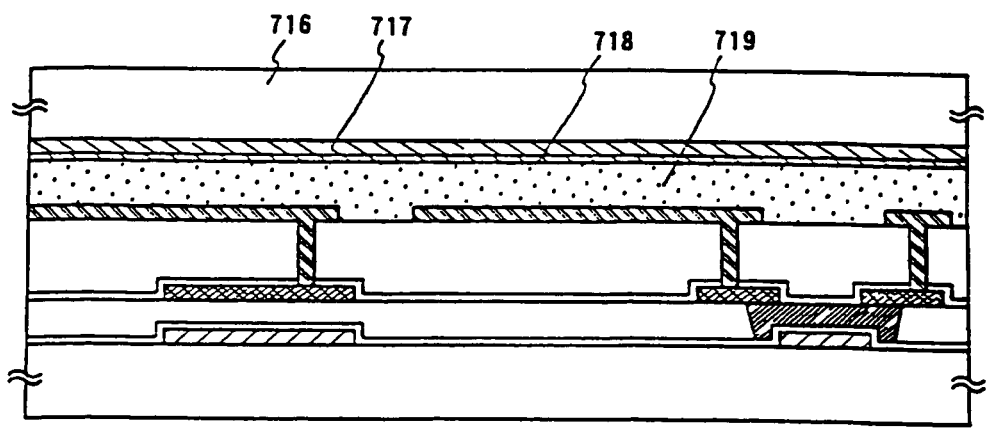

After formation to the step of FIG. 8C, as shown in FIG. 8D, a counter electrode 717 is formed on a counter substrate 716. An orientation film 718 is formed thereon, and a rubbing treatment is applied thereto. The counter electrode 717 is made of an ITO. Moreover, although it is not shown, a columnar spacer may be formed at a desired position for maintaining the substrate distance by patterning an organic resin film such as an acrylic resin film before formation of the orientation film 718. Furthermore, a spherical spacer may be scattered on the substrate entire surface instead of the columnar spacer.

Then, the counter substrate 716 is attached with the substrate. Thereafter, a liquid crystal material 719 is injected between the substrates, and they are sealed completely by a sealant (not shown). As the liquid crystal material, a known liquid crystal material can be used. Accordingly, liquid crystal display device by active matrix driving method shown in FIG. 7 can be completed.

Example 5

The semiconductor device of the present invention can be applied to various electronic devices.

Such electronic devices using the present invention include a video camera, a digital camera, a goggles-type display (head mount display), a navigation system, a sound reproduction device (a car audio equipment and an audio set), a lap-top computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital versatile disc (DVD) and so forth, and includes a display for displaying the reproduced image), or the like. In FIGS. 11A to 11H respectively shows various specific examples of such electronic devices.

FIG. 11A illustrates an organic luminescent display device which includes a casing 2001, a support table 2002, a display portion 2003, a speaker portion 2004, a video input terminal 2005 or the like. The present invention is applicable to the display portion 2003. The display device is including all of the display device for displaying information, such as a personal computer, a receiver of TV broadcasting and an advertising display.

FIG. 11B illustrated a digital still camera which includes a main body 2101, a display portion 2102, an image receiving portion 2103, an operation key 2104, an external connection port 2105, a shutter 2106, or the like. The present invention can be used as the display portion 2102 and other circuits.

FIG. 11C illustrates a lap-top computer which includes a main body 2201, a casing 2202, a display portion 2203, a keyboard 2204, an external connection port 2205, a pointing mouse 2206, or the like. The present invention can be used as the display portion 2203 and other circuits.

FIG. 11D illustrated a mobile computer which includes a main body 2301, a display portion 2302, a switch 2303, an operation key 2304, an infrared port 2305, or the like. The present invention can be used as the display portion 2302 and other circuits.

FIG. 11E illustrates an image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The present invention can be used as these display portions A 2403, B 2404 and other circuits. The image reproduction apparatus including a recording medium further includes a game machine or the like.

FIG. 11F illustrates a goggle type display (head mounted display) which includes a main body 2501, a display portion 2502, an arm portion 2503. The present invention can be used as the display portion 2502 and other circuits.

FIG. 11G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, or the like. The present invention can be used as the display portion 2602 other circuits.

FIG. 11H illustrates a mobile phone which includes a main body 2701, a casing 2702, a display portion 2703, a sound input portion 2704, a sound output portion 2705, an operation key 2706, an external connecting port 2707, an antenna 2708, or the like. The present invention can be used as the display portion 2703 and other circuits.

In addition, the front type projector and the rear type projector using a liquid crystal display device that is one of the organic semiconductor devices of the present invention may be included in electronic devices of the present invention. When the brighter luminance of light emitted from the organic luminescent material becomes available in the future, the present invention will be applicable to a front-type or rear-type projector in which light including output image information is enlarged by means of lenses or the like to be projected.

The application range of the present invention is quite large, so that the present invention can be used to various kinds of electronic devices. Further, this embodiment can be implemented by freely combining with the structure of Embodiments 1 to 4.

Since an organic TFT using an organic semiconductor material can be formed by executing the present invention, manufacturing by a low temperature process can be enabled so that the width of selecting the material used for the manufacturing can be widened. Moreover, since patterning of a soluble organic semiconductor material can be enabled, the size of the organic TFT can be made further smaller. Thereby, a highly sophisticated organic semiconductor device can be formed compared with the case of using the ink-jet method or the printing method, which have conventionally been used.

What is claimed is:

1. An organic semiconductor device using an organic thin film transistor comprising:
    a first electrode formed over an insulated surface,
    a first insulated film formed over the first electrode,
    a second insulated film formed over the first insulated film, having an opening part at a position superimposed over the first electrode,
    an organic semiconductor film formed in the opening part, and
    a second electrode and a third electrode formed over the organic semiconductor film and the second insulated film,
    wherein a top surface of the organic semiconductor film and a top surface of the second insulated film are coplanar with each other.

2. The organic semiconductor device according to claim 1, wherein the organic semiconductor film is made of a soluble organic semiconductor material.

3. The organic semiconductor device according to claim 1, wherein the second electrode and the third electrode are made of the same metal having a large work function.

4. The organic semiconductor device according to claim 3, wherein the second electrode and the third electrode comprise a metal selected from the group consisting of gold, platinum, chromium, palladium, aluminum, indium, molybdenum and nickel.

5. The organic semiconductor device according to claim 1, wherein the organic semiconductor device is incorporated into one selected from the group consisting of a display device, a digital still camera, a laptop personal computer, a mobile computer, a portable image reproducing device comprising a recording medium, a goggle type display, a video camera and a portable phone.

6. An organic semiconductor device using an organic thin film transistor comprising:
   a first electrode formed over an insulated surface,
   a first insulated film formed over the first electrode,
   a second insulated film formed over the first insulated film, having an opening part at a position superimposed over the first electrode,
   an organic semiconductor film formed in the opening part, and
   a second electrode and a third electrode formed over the organic semiconductor film and the second insulated film,
   wherein a top surface of the organic semiconductor film and a top surface of the second insulated film are coplanar with each other, and
   wherein the second electrode and the third electrode are formed without contact with each other.

7. The organic semiconductor device according to claim 6, wherein the organic semiconductor film is made of a soluble organic semiconductor material.

8. The organic semiconductor device according to claim 6, wherein the second electrode and the third electrode are made of the same metal having a large work function.

9. The organic semiconductor device according to claim 8, wherein the second electrode and the third electrode comprise a metal selected from the group consisting of gold, platinum, chromium, palladium, aluminum, indium, molybdenum and nickel.

10. The organic semiconductor device according to claim 6, wherein the organic semiconductor device is incorporated into one selected from the group consisting of a display device, a digital still camera, a laptop personal computer, a mobile computer, a portable image reproducing device comprising a recording medium, a goggle type display, a video camera and a portable phone.

11. An organic semiconductor device using an organic thin film transistor comprising:
   a first electrode formed over an insulated surface,
   a first insulated film formed over the first electrode,
   a second insulated film formed over the first insulated film, having an opening part at a position superimposed over the first electrode,
   an organic semiconductor film formed in the opening part, and
   a second electrode and a third electrode formed over the organic semiconductor film and the second insulated film,
   wherein a top surface of the organic semiconductor film and a top surface of the second insulated film are coplanar with each other, and
   wherein the second insulated film has a tapered rim.

12. The organic semiconductor device according to claim 11, wherein the organic semiconductor film is made of a soluble organic semiconductor material.

13. The organic semiconductor device according to claim 11, wherein the second electrode and the third electrode are made of the same metal having a large work function.

14. The organic semiconductor device according to claim 13, wherein the second electrode and the third electrode comprise a metal selected from the group consisting of gold, platinum, chromium, palladium, aluminum, indium, molybdenum and nickel.

15. The organic semiconductor device according to claim 11, wherein the organic semiconductor device is incorporated into one selected from the group consisting of a display device, a digital still camera, a laptop personal computer, a mobile computer, a portable image reproducing device comprising a recording medium, a goggle type display, a video camera and a portable phone.

16. An organic semiconductor device using an organic thin film transistor comprising:
   a first electrode formed over an insulated surface,
   a first insulated film formed over the first electrode,
   a second insulated film formed over the first insulated film, having an opening part at a position superimposed over the first electrode,
   an organic semiconductor film formed in the opening part, and
   a second electrode and a third electrode formed over the organic semiconductor film and the second insulated film,
   wherein a top surface of the organic semiconductor film and a top surface of the second insulated film are coplanar with each other, and
   wherein the organic semiconductor film is formed in contact with the first insulated film.

17. The organic semiconductor device according to claim 16, wherein the organic semiconductor film is made of a soluble organic semiconductor material.

18. The organic semiconductor device according to claim 16, wherein the second electrode and the third electrode are made of the same metal having a large work function.

19. The organic semiconductor device according to claim 18, wherein the second electrode and the third electrode comprise a metal selected from the group consisting of gold, platinum, chromium, palladium, aluminum, indium, molybdenum and nickel.

20. The organic semiconductor device according to claim 16, wherein the organic semiconductor device is incorporated into one selected from the group consisting of a display device, a digital still camera, a laptop personal computer, a mobile computer, a portable image reproducing device comprising a recording medium, a goggle type display, a video camera and a portable phone.

21. A semiconductor device comprising:
   a gate electrode provided over a substrate;
   a gate insulator comprising a first insulating film and a second insulating film, said first insulating film provided over said gate electrode, said second insulating film provided over said first insulating film, said second insulating film provided with an opening part at a position superimposed over said gate electrode;
   a channel region provided over said gate electrode with said gate insulator therebetween, said channel region provided in an organic semiconductor film provided in said opening part; and a source electrode and a drain electrode provided over said organic semiconductor film and the second insulated film, wherein a top surface of said organic semiconductor film and a top surface of said second insulating film are coplanar with each other.

22. The organic semiconductor device according to claim 21, wherein the source electrode and the drain electrode comprise a metal selected from the group consisting of gold, platinum, chromium, palladium, aluminum, indium, molybdenum and nickel.

23. The organic semiconductor device according to claim 21, wherein said semiconductor device is incorporated into one selected from the group consisting of a display device, a digital still camera, a laptop personal computer, a mobile computer, a portable image reproducing device comprising a recording medium, a goggle type display, a video camera and a portable phone.

24. A semiconductor device comprising:

a gate electrode provided over a substrate;

a gate insulator comprising a first insulating film and a second insulating film, said first insulating film provided over said gate electrode, said second insulating film provided over said first insulating film, said second insulating film provided with an opening part at a position superimposed over said gate electrode;

a channel region provided over said gate electrode with said gate insulator therebetween, said channel region provided in an organic semiconductor film provided in said opening part; and a source electrode and a drain electrode provided over said organic semiconductor film and the second insulated film, wherein a top surface of said organic semiconductor film and a top surface of said second insulating film are coplanar with each other, and wherein a rim of said opening part is tapered.

25. The organic semiconductor device according to claim 24, wherein the source electrode and the drain electrode comprise a metal selected from the group consisting of gold, platinum, chromium, palladium, aluminum, indium, molybdenum and nickel.

26. The organic semiconductor device according to claim 24, wherein said semiconductor device is incorporated into one selected from the group consisting of a display device, a digital still camera, a laptop personal computer, a mobile computer, a portable image reproducing device comprising a recording medium, a goggle type display, a video camera and a portable phone.

27. A semiconductor device comprising:

a gate electrode provided over a substrate;

a gate insulator comprising a first insulating film and a second insulating film, said first insulating film provided over said gate electrode, said second insulating film provided over said first insulating film said second insulating film provided with an opening part at a position superimposed over said gate electrode;

a channel region provided over said gate electrode with said gate insulator therebetween, said channel region provided in an organic semiconductor film provided in said opening part; and a source electrode and a drain electrode provided over said organic semiconductor film and the second insulated film, wherein a top surface of said organic semiconductor film and a top surface of said second insulating film are coplanar with each other, and wherein said organic semiconductor film is provided in contact with said first insulating film.

28. The organic semiconductor device according to claim 27, wherein the source electrode and the drain electrode comprise a metal selected from the group consisting of gold, platinum, chromium, palladium, aluminum, indium, molybdenum and nickel.

29. The organic semiconductor device according to claim 27, wherein said semiconductor device is incorporated into one selected from the group consisting of a display device, a digital still camera, a laptop personal computer, a mobile computer, a portable image reproducing device comprising a recording medium, a goggle type display, a video camera and a portable phone.

* * * * *